(12) United States Patent  
Yuki

(10) Patent No.: US 7,713,828 B2  
(45) Date of Patent: May 11, 2010

(54) SEMICONDUCTOR DEVICE AND METHOD OF FORMING THE SAME

(75) Inventor: Kazuyoshi Yuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 182 days.

(21) Appl. No.: 11/940,831

(22) Filed: Nov. 15, 2007

(65) Prior Publication Data

US 2008/0116583 A1 May 22, 2008

(30) Foreign Application Priority Data

Nov. 20, 2006 (JP) ............................ 2006-313179

(51) Int. Cl.
*H01L 21/336* (2006.01)

(52) U.S. Cl. .................. 438/300; 438/199; 438/222; 438/637; 257/E21.09; 257/E21.177; 257/E21.562

(58) Field of Classification Search ............... 438/269, 438/607; 257/E21.177, E21.461, E21.562
See application file for complete search history.

(56) References Cited

U.S. PATENT DOCUMENTS 6,376,318 B1 * 4/2002 Lee et al. .................... 438/300

FOREIGN PATENT DOCUMENTS

| JP | 2-079462 A | 3/1990 |
|----|------------|--------|
| JP | 3-049259 A | 3/1991 |
| JP | 9-252094 A | 9/1997 |
| JP | 2003-124144 A | 4/2003 |
| JP | 2004-040118 A | 2/2004 |
| JP | 2005-251776 A | 9/2005 |

* cited by examiner

*Primary Examiner*—Savitri Mulpuri  
*Assistant Examiner*—Cheung Lee  
(74) *Attorney, Agent, or Firm*—Sughrue Mion, PLLC

(57) ABSTRACT

A semiconductor device includes a semiconductor substrate, source and drain regions on the semiconductor substrate, and contact plugs connected to the source and drain regions. The contact plugs includes first impurity-diffused epitaxial layers that contact with the source and drain regions.

7 Claims, 14 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2006-313179, filed Nov. 20, 2006, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

In recent years, computers or electric devices include one or more large scale integrated circuits, hereinafter referred to as LSI, in which a large number of MOS transistors and resistances may typically be integrated on a single chip. Dynamic random access memories (DRAMs) include LSIs. The DRAM needs shrinkage of LSI. Shrinkage of the LSI may cause remarkable short channel effects of the MOS transistors integrated in the LSI, even the short channel effects are desired to be suppressed.

Japanese Unexamined Patent Application, First Publication, No. 2005-251776 discloses a conventional technique for suppressing the short channel effects of the MOS transistor. In accordance with the conventional technique, epitaxial silicon layers are electively formed by a selective epitaxial growth over source and drain regions of a substrate. The epitaxial silicon layers are used as source and drain regions of the MOS transistor. Increasing the thickness of the epitaxial silicon layers enhances the suppression of the short channel effects of the MOS transistor.

The shrinking DRAM cell size, particularly 6F2 cell, needs a narrow pitch field pattern. As described above, the epitaxial silicon layers act as the source and drain regions of the MOS transistors in the memory cells. In the selective epitaxial growth, the epitaxial silicon layers are grown not only in the thickness direction but also in the lateral direction perpendicular to the thickness direction. Increasing the thickness of the epitaxial silicon layers increases the growth in the lateral direction of the epitaxial silicon layers. If the pitch of the field pattern is very narrow, increasing the thickness of the epitaxial silicon layers narrows a gap between the epitaxial silicon layers. In some cases, the thickness of the epitaxial silicon layers may form a short circuit between the epitaxial silicon layers.

The MOS transistors are further used in peripheral circuits of the DRAM. Shrinkage of the DRAM needs shrinkage of the peripheral circuits. Shrinkage of the peripheral circuits may reduce contact areas between the source and drain diffusion regions and contact plugs. Reduction in the between the source and drain diffusion regions and contact plugs increases contact resistances between the source and drain diffusion regions and contact plugs, even the contact resistances are desired to be low.

A known conventional technique for reducing the contact resistances of the MOS transistors in the peripheral circuits is to carry out an ion-implantation at a high impurity concentration for implanting ions into epitaxial silicon layers, parts of which are adjacent to contact holes, in which the contact plugs are formed, wherein the epitaxial silicon layers are disposed over the source and drain regions of a substrate.

In order to avoid the above-described problems, it is necessary that the epitaxial silicon layer is not thick. Ion-implantation for introducing ions into the non-thick epitaxial silicon layers at a high concentration may enhance the short channel effects of the MOS transistor. Namely, carrying out the ion-implantation for introducing ions into non-thick epitaxial silicon layers at a high concentration may cause that the ions will be diffused by a subsequent diffusion process into the source and drain diffusion regions that are disposed under the epitaxial silicon layers. As a result, the impurity concentration of the source and drain diffusion regions unintentionally increased, thereby enhancing the short channel effects.

In view of the above, it will be apparent to those skilled in the art from this disclosure that there exists a need for a semiconductor device and a method of forming the same. This invention addresses this need in the art as well as other needs, which will become apparent to those skilled in the art from this disclosure.

SUMMARY OF THE INVENTION

Accordingly, it is a primary object of the present invention to provide a semiconductor device.

It is another object of the present invention to provide a semiconductor device free from the above-described problems or disadvantages.

It is a further object of the present invention to provide a semiconductor device that can suppress short channel effects.

It is a still further object of the present invention to provide a semiconductor device that can reduce contact resistance between source and drain regions and contact plugs thereof.

It is still another object of the present invention to provide a semiconductor device that is suitable for allowing shrinkage of a DRAM that includes a peripheral circuit integrating the semiconductor device.

It is yet a further object of the present invention to provide a method of forming a semiconductor device.

It is an additional object of the present invention to provide a method of forming a semiconductor device free from the above-described problems or disadvantages.

It is another object of the present invention to provide a method of forming a semiconductor device that can suppress short channel effects.

It is still another object of the present invention to provide a method of forming a semiconductor device that can reduce contact resistance between source and drain regions and contact plugs.

It is yet another object of the present invention to provide a method of forming a semiconductor device that is suitable for allowing shrinkage of a DRAM that includes a peripheral circuit integrating the semiconductor device.

In accordance with a first aspect of the present invention, a semiconductor device may include a semiconductor substrate, source and drain regions on the semiconductor substrate, and contact plugs connected to the source and drain regions. The contact plugs include first impurity-diffused epitaxial layers that contact with the source and drain regions.

Each of the source and drain regions may include a diffusion layer in the semiconductor substrate, and a second impurity-diffused epitaxial layer over the diffusion layer. The second impurity-diffused epitaxial layer is positioned above the semiconductor substrate.

In accordance with a second aspect of the present invention, a method of forming a semiconductor device may include the following steps. Source and drain regions are formed on a semiconductor substrate. Contact plug impurity-diffused epitaxial layers are formed over the source and drain regions. The contact plug impurity-diffused epitaxial layers serve as at least parts of contact plugs.

The formation of the source and drain regions may include forming diffusion layers in the semiconductor substrate, and forming impurity-diffused epitaxial layers over the diffusion layers.

In accordance with a third aspect of the present invention, a method of forming a MOS transistor in an active region surrounded by an isolation film may include the following steps. A gate insulating film is formed on a first part of the active region. A gate electrode is formed on the gate insulating film. Diffusion layers are formed in second parts of the active region. The second parts are different from the first part. First epitaxial layers of silicon are formed on the diffusion layers. A first impurity is introduced into the first epitaxial layers and form source and drain regions which comprise stacks of the first epitaxial layers and the diffusion layers. An inter-layer insulator is formed which covers the gate electrode and the source and drain regions. Contact holes are formed in the inter-layer insulator. The contact holes reach the source and drain regions. Second epitaxial layers of silicon are formed in the contact holes. The second epitaxial layers contact with the source and drain regions. An impurity is introduced into the second epitaxial layers to form at least parts of contact plugs.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

In the following embodiment, a semiconductor device is applied to a DRAM.

Figure 1:
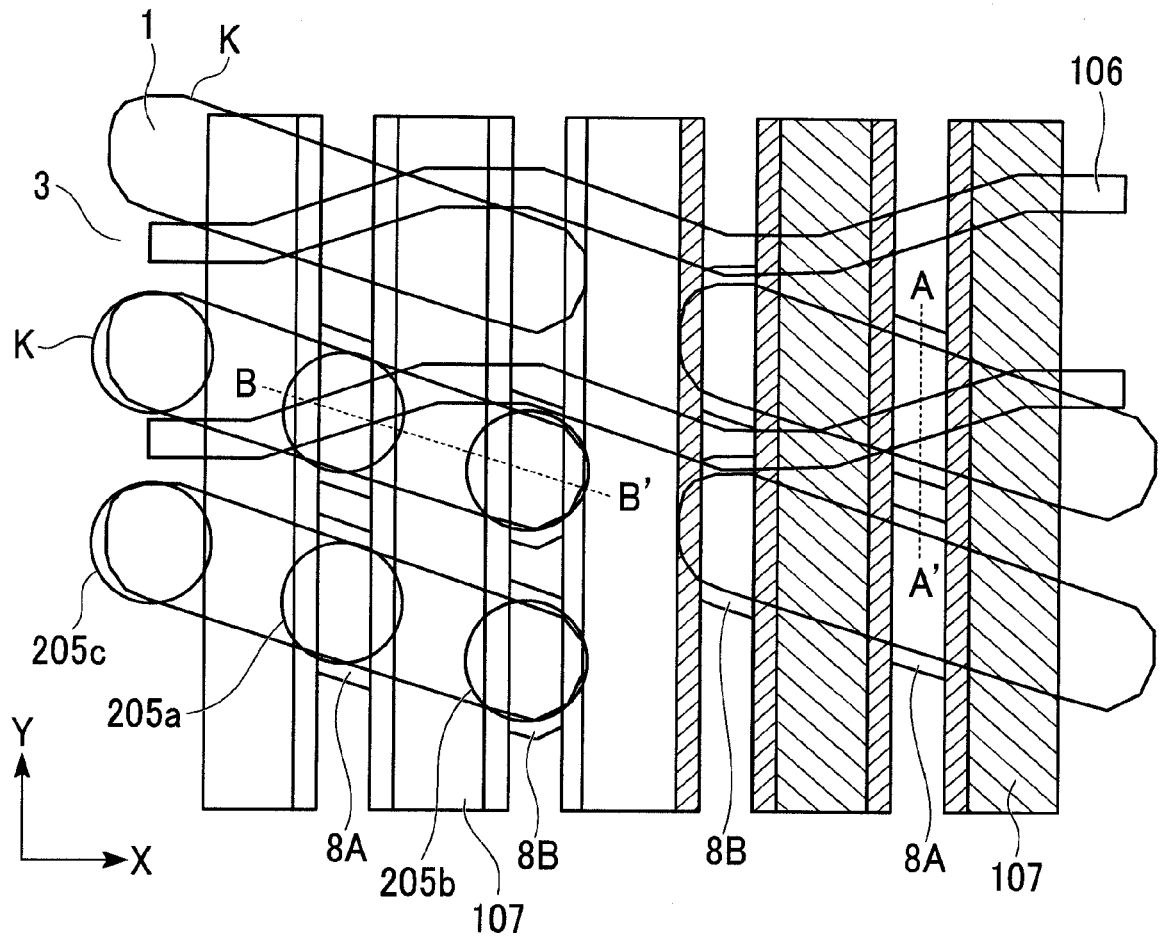
FIG. 1 is a fragmentary plan view illustrating an array of memory cells of a semiconductor device in accordance with a first embodiment of the present invention.
Figure 2:
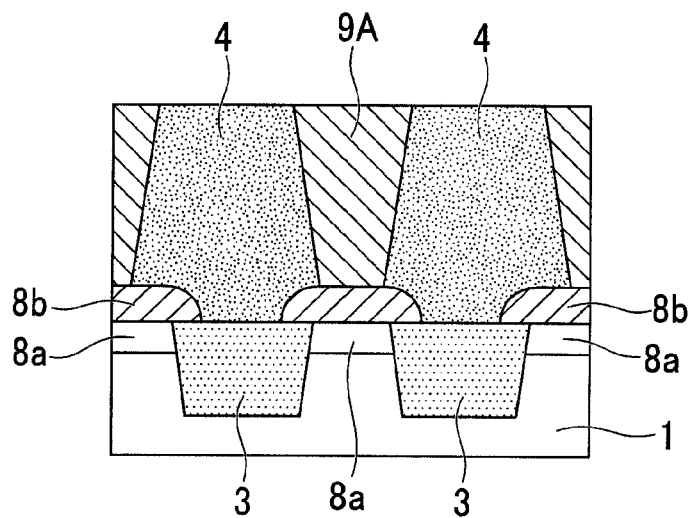
FIG. 2 is a fragmentary cross sectional elevation view illustrating the semiconductor device, taken along an A-A' line of FIG. 1.
Figure 3:
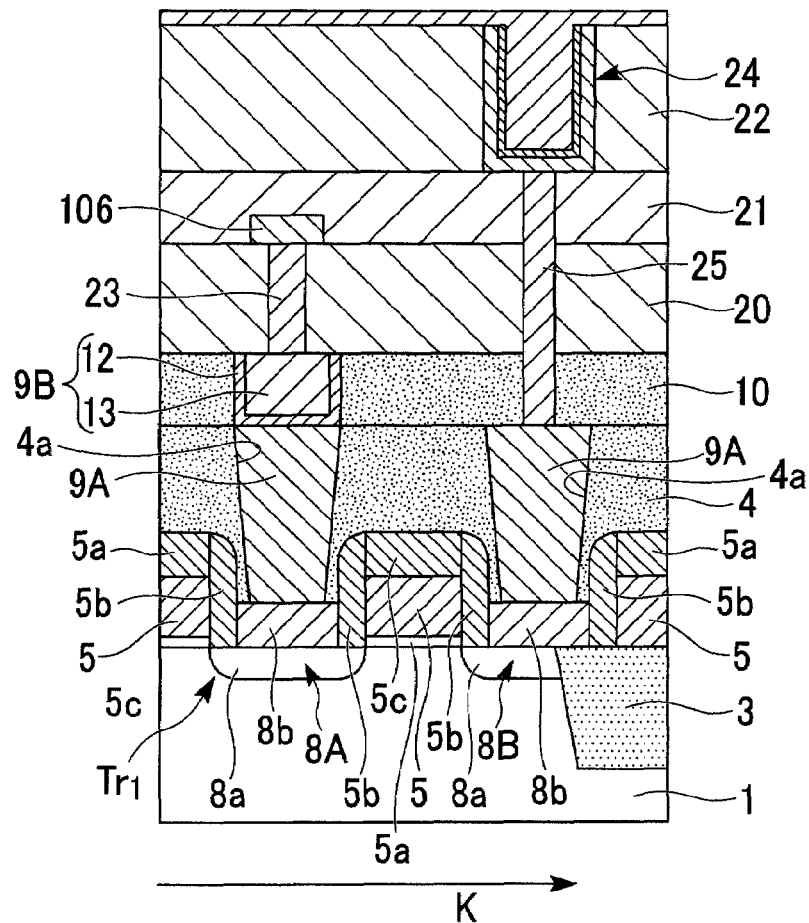
FIG. 3 is a fragmentary cross sectional elevation view illustrating a memory cell structure of the semiconductor device, taken along a B-B' line of FIG. 1.
Figure 4:
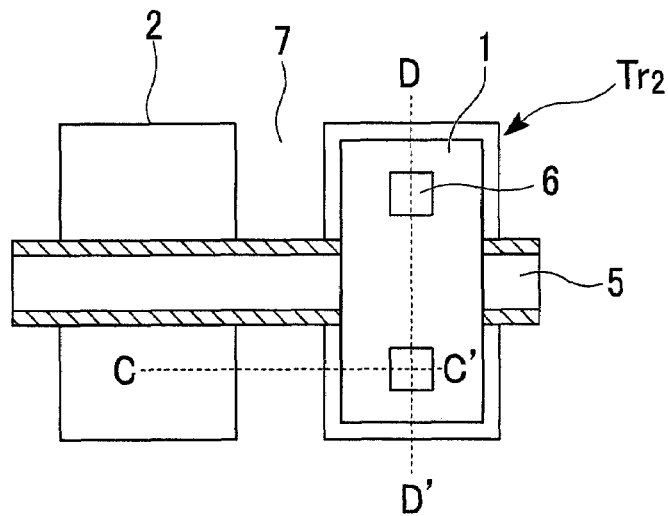
FIG. 4 is a fragmentary plan view illustrating a part of peripheral circuits of the semiconductor device in accordance with a first embodiment of the present invention.
Figure 5:
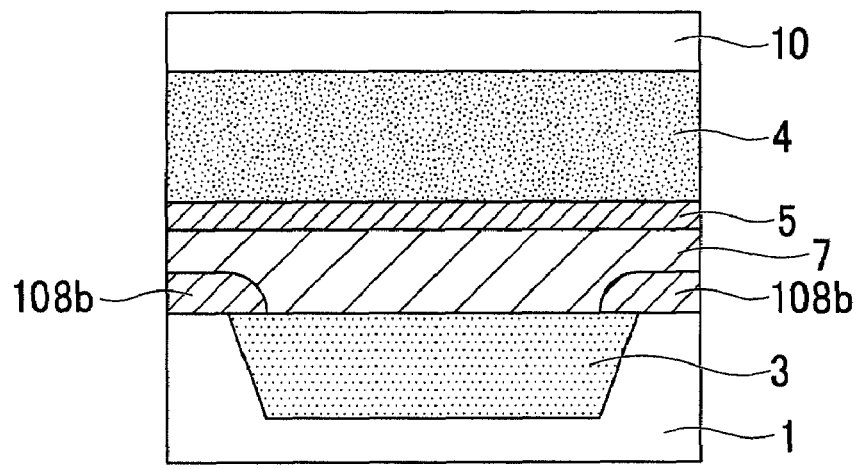
FIG. 5 is a fragmentary cross sectional elevation view illustrating the semiconductor device, taken along a C-C' line of FIG. 4.
Figure 6:
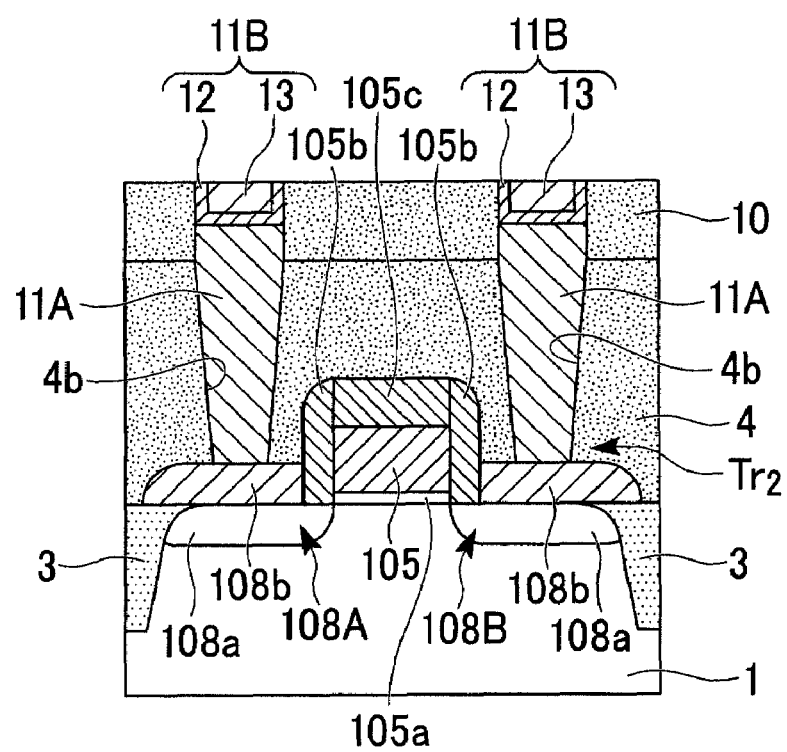
FIG. 6 is a fragmentary cross sectional elevation view illustrating the semiconductor device, taken along a D-D' line of FIG. 4.

FIG. 1 is a fragmentary plan view illustrating an array of memory cells of a semiconductor device in accordance with a first embodiment of the present invention. FIG. 2 is a fragmentary cross sectional elevation view illustrating the semiconductor device, taken along an A-A' line of FIG. 1. FIG. 3 is a fragmentary cross sectional elevation view illustrating a memory cell structure of the semiconductor device, taken along a B-B' line of FIG. 1. FIG. 4 is a fragmentary plan view illustrating a part of peripheral circuits of the semiconductor device in accordance with a first embodiment of the present invention. FIG. 5 is a fragmentary cross sectional elevation view illustrating the semiconductor device, taken along a C-C' line of FIG. 4. FIG. 6 is a fragmentary cross sectional elevation view illustrating the semiconductor device, taken along a D-D' line of FIG. 4.

The semiconductor device of this embodiment of the present invention is applied to a DRAM device. The DRAM device includes a memory cell area and a peripheral circuit area. The memory cell area includes MOS transistors Tr1. The peripheral circuit area includes MOS transistors Tr2.

The memory cell area will be described hereinafter with reference to FIGS. 1 through 3 and then the peripheral circuit area will subsequently be described. The memory cell area has a two dimensional array of memory cells.

As shown in FIG. 3, each memory cell may include a MOS transistor Tr1 and a capacitor 24. The capacitor 24 is connected to the MOS transistor Tr1 through contact plugs 9A and 25.

As shown in FIGS. 1, 2 and 3, the DRAM is formed on a semiconductor substrate 1. The semiconductor substrate 1 may be made of a semiconductor that contains an impurity at a certain concentration. A typical example of the semiconductor may be, but is not limited to, silicon. An isolation film 3 is selectively formed in the semiconductor substrate 1. The isolation film 3 electrically isolates each active region K from other active regions K. Namely, the isolation film 3 is formed in other region than the active regions K. The isolation film 3 may typically be, but is not limited to, a trench isolation such as a shallow trench isolation. The shallow trench isolation can be formed by a shallow trench isolation method. In some cases, a 2-bit memory cell can be arranged in each active region K, even this arrangement is not essential.

As shown in FIG. 1, the semiconductor device may include the two-dimensional array of the active regions K. In some cases, the active regions K may be aligned in Y-direction at a constant pitch. The active regions K may also be aligned at another constant pitch in an oblique direction to X-direction, wherein X-direction is perpendicular to Y-direction. Each active region K may have a slender shape having a longitudinal direction that is parallel to the oblique direction.

A first type diffusion layer 8A may selectively be disposed at the center of each active region K. Second type diffusion layers 8B may selectively be disposed at opposite sides of each active region K. The first type diffusion layer 8A may serve as a source region, while the second type diffusion layers 8B may serve as drain regions. The source region 8A may be positioned at the center of each active region K. The drain regions 8B may be positioned at the opposing sides of each active region K.

A first substrate contact 205A may be positioned directly over the source region 8A. A second substrate contact 205B may be positioned directly over the drain region 8B. A third substrate contact 205C may be positioned directly over the other drain region 8B. The first substrate contact 205A may selectively be disposed at the center of each active region K. The second and third substrate contacts 205B and 20C may be disposed at the opposite sides of each active region K.

The shape and the longitudinal direction of each active region K as well as the array pattern and alignment directions should not be limited but can be modified as long as they are actually applicable to the device.

As shown in FIG. 1, a plurality of bit lines 106 are provided, which may extend generally along X-direction. Each bit line 106 may run wavy and generally along X-direction. The plurality of bit lines 106 may be generally parallel to each other and distanced at a contact pitch in Y-direction.

A plurality of word lines 107 are also provided, which may extend along Y-direction. Each word line 107 may run straightly and along Y-direction. The plurality of word lines 107 may be parallel to each other and distanced at a contact pitch in X-direction. Each word line 107 may run crossing over the plurality of active regions K. In other words, each word line 107 may have a plurality of crossing portions which overlap the active regions K. The crossing portions act as gate electrodes 5 of trench gate transistors.

As shown in FIGS. 2 and 3, the source and drain regions 8A and 8B are formed in each active region K in the semiconductor substrate 1. The active region K is isolated by the isolation film 3 from other active regions K. The source and drain regions 8A and 8B are separated from each other. A channel region is disposed between the source and drain regions 8A and 8B. A gate insulating film 5a extends over the channel region. The gate electrode 5 is provided over the gate insulating film 5a. The gate electrode 5 may have a multilayer structure. In some cases, the gate electrode 5 may be realized by, but is not limited to, a stack of a polysilicon film and a metal film. The polysilicon film may be a doped polysilicon film that is formed by a chemical vapor deposition method. The metal film may be made of a refractory metal such as tungsten (W) and tungsten silicide (WSi).

As described above, the gate insulating film 5a is provided between the gate electrode 5 and the channel region of the semiconductor substrate 1. Side wall insulating films 5b may be formed on side walls of the gate electrode 5. The side wall insulating films 5b may be made of silicon nitride. An insulating film 5c is provided over the gate electrode 5. The insulating film 5c may be made of silicon nitride.

Each of the source and drain regions 8A and 8B may include an impurity diffusion layer 8a and a first epitaxial layer 8b. The impurity diffusion layer 8a may be formed in the semiconductor substrate 1. The first epitaxial layer 8b may be formed over the impurity diffusion layer 8a. The impurity diffusion layer 8a may be an n-type diffusion layer. In this case, the impurity diffusion layer 8a may be formed of an As-diffused region of the semiconductor substrate 1. The first epitaxial layer 8b may be an n-type epitaxial layer. The first epitaxial layer 8b may be formed of an As-doped epitaxial silicon layer.

A first inter-layer insulator 4 may be formed over the first epitaxial layer 8b, the insulating film 5c, the side wall insulating films 5b, and the isolation film 3. Contact holes 4a are formed in the first inter-layer insulator 4. The contact holes 4a communicate with the source and drain regions 8A and 8B. Contact plugs 9A are formed in the contact holes 4a. The contact plugs 9A contact with the first epitaxial layers 8b of the source and drain regions 8A and 8B. Namely, the contact plugs 9A are connected to the source and drain regions 8A and 8B. In some cases, the contact plugs 9A may be formed of a phosphorous-doped silicon layer.

A second inter-layer insulator 10 may be formed over the first inter-layer insulator 4 and the contact plugs 9A. A first bit-line contact hole is formed in the second inter-layer insulator 10. A first bit-line contact plug 9B is formed in the bit-line contact hole in the second inter-layer insulator 10. The first bit-line contact plug 9B contacts with the contact plug 9A. The first bit-line contact plug 9B is electrically connected through the contact plug 9A to the source region 8A. The first bit line contact plug 9B may be formed of a stack of a titanium/titanium nitride film 12 and a metal film 13. The titanium/titanium nitride film 12 is a stack of a titanium film and a titanium nitride film. The titanium/titanium nitride film 12 is formed on the first contact plugs 9A and the side wall of the bit-line contact hole in the second inter-layer insulator 10. The metal film 13 is formed on the titanium/titanium nitride film 12. The titanium film of the titanium/titanium nitride film 12 may react with silicon atom in the first bit-line contact plug 9B, thereby forming titanium silicide.

A third inter-layer insulator 20 may be formed over the second inter-layer insulator 10 and the first bit-line contact plug 9B. A contact hole is formed in the third inter-layer insulator 20. The contact hole communicates with the first bit-line contact plug 9B. A second bit-line contact plug 23 is formed in the contact hole. The second bit-line contact plug 23 contacts with the first bit-line contact plug 9B. The second bit-line contact plug 23 is electrically connected through the first bit-line contact plug 9B and the contact plug 9A to the source region 8A.

A bit-line 106 may be formed over the third inter-layer insulator 20. The bit-line 106 contacts with the second bit-line contact plug 23. The bit-line 106 is electrically connected through the second bit-line contact plug 23, the first bit-line contact plug 9B and the contact plug 9A to the source region 8A. The bit-line 106 may be formed of a stack of a tungsten nitride film and a tungsten film.

A fourth inter-layer insulator 21 may be formed over the third inter-layer insulator 20 and the bit-line 106. A capacitor contact hole is formed which penetrates the second, third and fourth inter-layer insulators 10, 20 and 21 so that the contact hole communicates with the contact plug 9A that is connected to the drain region 8B. A capacitor contact plug 25 is formed in the capacitor contact hole. The capacitor contact plug 25 contacts with the contact plug 9A that is connected to the drain region 8B. The capacitor contact plug 25 is connected through the contact plug 9A to the drain region 8B.

A fifth inter-layer insulator 22 may be formed over the fourth inter-layer insulator 21 and the capacitor contact plug 25. A capacitor hole is formed in the fifth inter-layer insulator 22. The capacitor hole reaches the capacitor contact plug 25. A capacitor 24 is formed in the capacitor hole. The capacitor 24 contacts with the capacitor contact plug 25. The capacitor 24 has a bottom electrode film which contacts with the capacitor contact plug 25 and the bottom and side wall of the capacitor hole. The capacitor 24 also has a capacitive insulating film that is formed on the bottom electrode. The capacitor 24 also has an opposite electrode film that is formed on the capacitive insulating film and on the fifth inter-layer insulator 22.

The peripheral circuit area of the semiconductor device will be described with reference to FIGS. 4 through 6. As shown in FIG. 6, a MOS transistor Tr2 is provided in the peripheral circuit area.

As shown in FIGS. 5 and 6, in the peripheral circuit area of the semiconductor substrate 1, active regions K are defined by the isolation film 3 so that each active region K is separated by the isolation film 3 from other active regions K. Source and drain regions 108A and 108B are formed in each active region K in the peripheral circuit area of the semiconductor substrate 1. The source and drain regions 108A and 108B are separated from each other. A channel region is disposed between the source and drain regions 108A and 108B. A gate insulating film 105a extends over the channel region. A gate electrode 105 is provided over the gate insulating film 105a. The gate electrode 105 may have a multilayer structure. In some cases, the gate electrode 105 may be realized by, but is not limited to, a stack of a polysilicon film and a metal film. The polysilicon film may be a doped polysilicon film that is formed by a chemical vapor deposition method. The metal film may be made of a refractory metal such as tungsten (W) and tungsten silicide (WSi).

As described above, the gate insulating film 105a is provided between the gate electrode 105 and the channel region of the semiconductor substrate 1. Side wall insulating films 105b may be formed on side walls of the gate electrode 105. The side wall insulating films 105b may be made of silicon nitride. An insulating film 105c is provided over the gate electrode 105. The insulating film 105c may be made of silicon nitride.

Each of the source and drain regions 108A and 108B may include an impurity diffusion layer 108a and a first epitaxial layer 108b. The impurity diffusion layer 108a may be formed in the semiconductor substrate 1. The first epitaxial layer 108b may be formed over the impurity diffusion layer 108a. The impurity diffusion layer 108a may be an n-type diffusion layer. In this case, the impurity diffusion layer 108a may be formed of an As-diffused region of the semiconductor substrate 1. The first epitaxial layer 108b may be an n-type epitaxial layer. The first epitaxial layer 108b may be formed of an As-doped epitaxial silicon layer.

A first inter-layer insulator 4 may be formed over the first epitaxial layer 108b, the insulating film 105c, the side wall insulating films 105b, and the isolation film 3. A second inter-layer insulator 10 may be formed over the first inter-layer insulator 4. Contact holes 4b are formed, which penetrate the first and second inter-layer insulators 4 and 10. The contact holes 4b communicate with the source and drain regions 108A and 108B. Contact plugs 11A are formed in the contact holes 4b except for upper regions of the contact holes 4b. The tops of the contact plugs 11A are lower than the top of the second inter-layer insulator 10. The contact plugs 11A contact with the first epitaxial layers 108b of the source and drain regions 108A and 108B. Namely, the contact plugs 11A are connected to the source and drain regions 108A and 108B. In some cases, the contact plugs 11A may be epitaxially grown. In this case, the contact plugs 11A may be realized by second epitaxial layers 11A that are epitaxially grown in the contact holes 4b. The second epitaxial layer 11A may be an As-doped epitaxial silicon layer.

Pad metal layers 11B are formed in the upper regions of the contact holes 4b and over the second epitaxial layers 11A as the contact plug. The pad metal layers 11B contact with the second epitaxial layer 11A as the contact plug. The pad metal layers 11B are electrically connected through the second epitaxial layers 11A as the contact plugs to the source and drain regions 108A and 108B. Each of the pad metal layers 11B may be formed of a stack of a titanium/titanium nitride film 12 and a metal film 13. The titanium/titanium nitride film 12 is a stack of a titanium film and a titanium nitride film. The titanium/titanium nitride film 12 is formed on the second epitaxial layer 11A as the contact plug and the side wall of the upper portion of the contact hole 4b. The metal film 13 is formed on the titanium/titanium nitride film 12. The titanium film of the titanium/titanium nitride film 12 may react with silicon atom in the second epitaxial layer 11A as the contact plug, thereby forming titanium silicide. Typically, the second epitaxial layer 11A as the contact plug may have a thickness of about 150 nanometers. The thickness is equal to a distance between the bottom and the top of the contact plug 11A. In other words, the thickness is defined from the surface of the first epitaxial layers 108b.

Figure 7A:
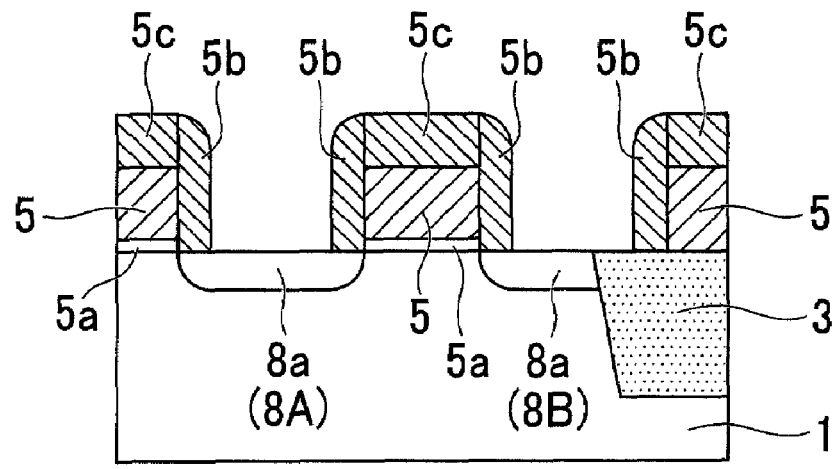
FIG. 7A is a fragmentary cross sectional elevation view illustrating the semiconductor device, taken along a B-B' line of FIG. 1, in a step involved in the method for forming the semiconductor device.
Figure 7B:
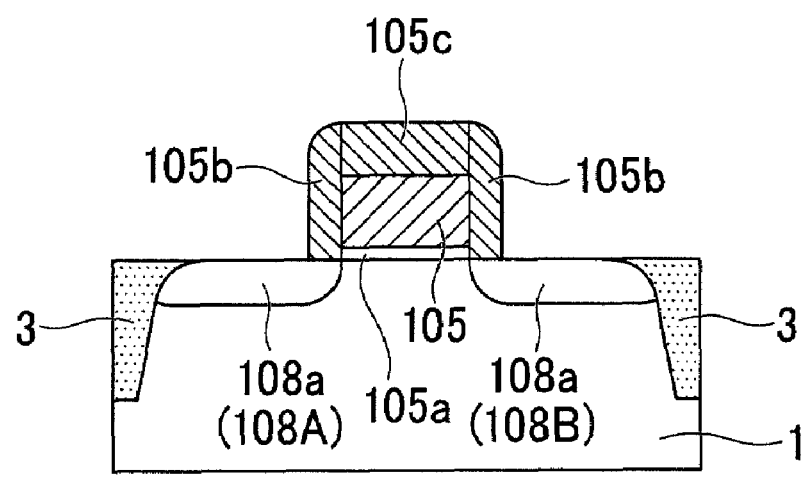
FIG. 7B is a fragmentary cross sectional elevation view illustrating the semiconductor device, taken along a D-D' line of FIG. 4, in the same step of FIG. 7A.

An example of the process for forming the semiconductor device will be described. The transistor Tr1 in the memory cell area and the transistor Tr2 in the peripheral circuit area may typically be formed concurrently. FIG. 7A is a fragmentary cross sectional elevation view illustrating the semiconductor device, taken along a B-B' line of FIG. 1, in a step involved in the method for forming the semiconductor device. FIG. 7B is a fragmentary cross sectional elevation view illustrating the semiconductor device, taken along a D-D' line of FIG. 4, in the same step of FIG. 7A.

Figure 8A:
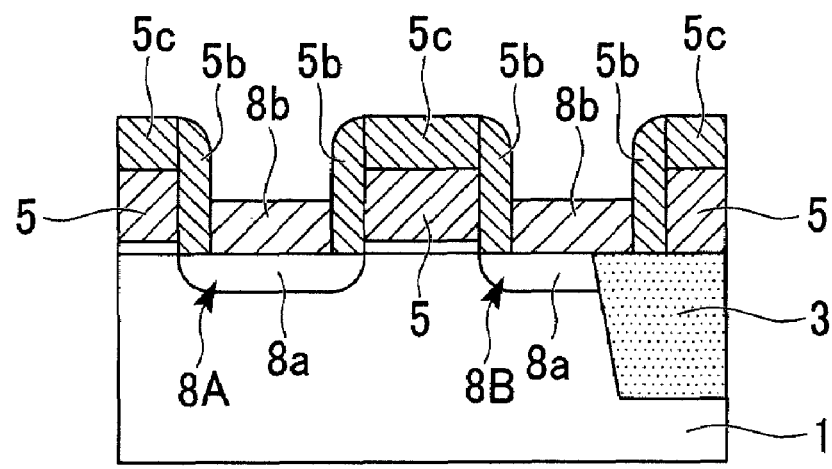
FIG. 8A is a fragmentary cross sectional elevation view illustrating the semiconductor device, taken along a B-B' line of FIG. 1, in a step subsequent to the step of FIGS. 7A and 7B, involved in the method for forming the semiconductor device.
Figure 8B:
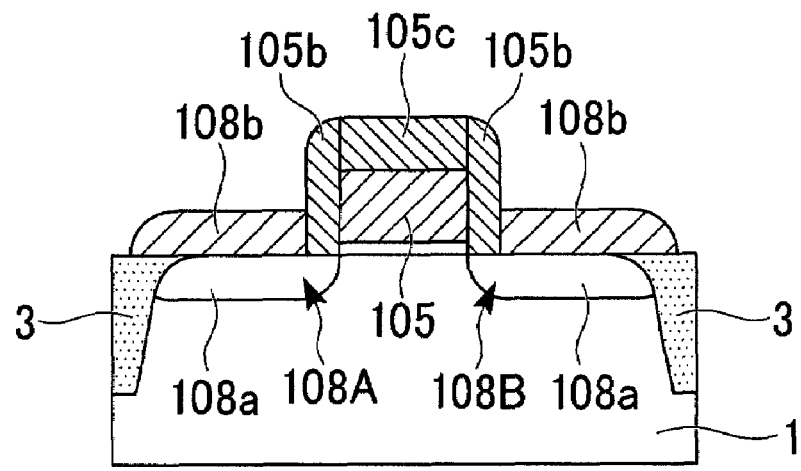
FIG. 8B is a fragmentary cross sectional elevation view illustrating the semiconductor device, taken along a D-D' line of FIG. 4, in the same step of FIG. 8A.

FIG. 8A is a fragmentary cross sectional elevation view illustrating the semiconductor device, taken along a B-B' line of FIG. 1, in a step subsequent to the step of FIGS. 7A and 7B, involved in the method for forming the semiconductor device. FIG. 8B is a fragmentary cross sectional elevation view illustrating the semiconductor device, taken along a D-D' line of FIG. 4, in the same step of FIG. 8A.

Figure 9A:
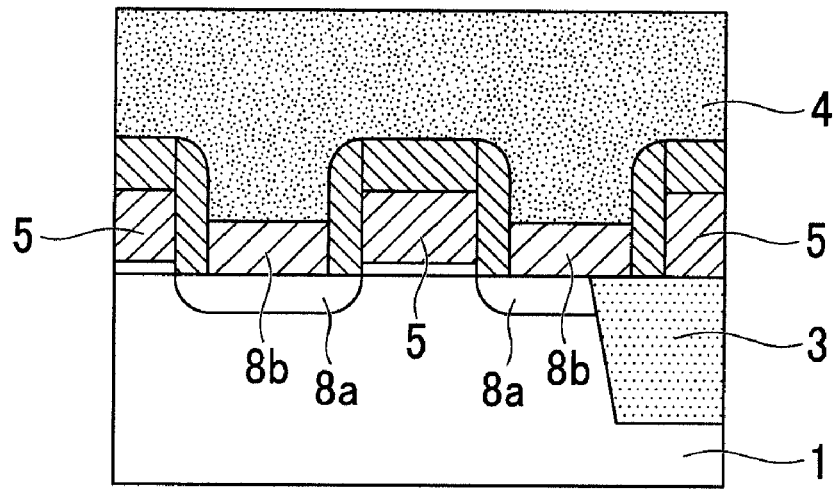
FIG. 9A is a fragmentary cross sectional elevation view illustrating the semiconductor device, taken along a B-B' line of FIG. 1, in a step subsequent to the step of FIGS. 8A and 8B, involved in the method for forming the semiconductor device.
Figure 9B:
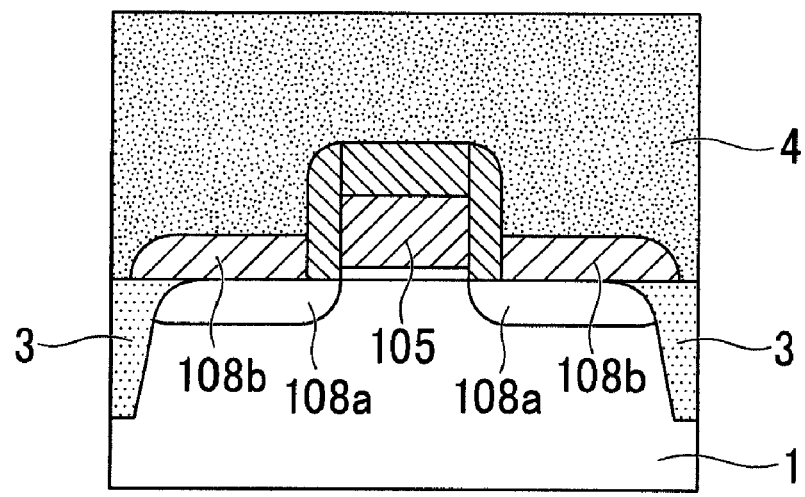
FIG. 9B is a fragmentary cross sectional elevation view illustrating the semiconductor device, taken along a D-D' line of FIG. 4, in the same step of FIG. 9A.

FIG. 9A is a fragmentary cross sectional elevation view illustrating the semiconductor device, taken along a B-B' line of FIG. 1, in a step subsequent to the step of FIGS. 8A and 8B, involved in the method for forming the semiconductor device. FIG. 9B is a fragmentary cross sectional elevation view illustrating the semiconductor device, taken along a D-D' line of FIG. 4, in the same step of FIG. 9A.

Figure 10A:
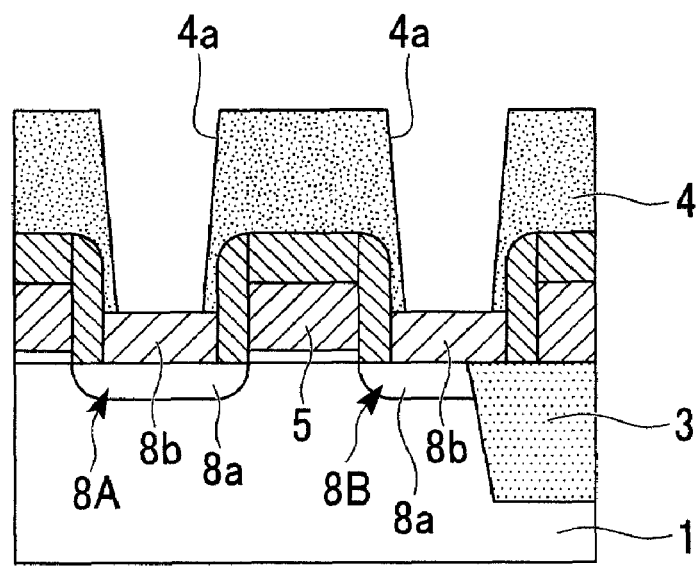
FIG. 10A is a fragmentary cross sectional elevation view illustrating the semiconductor device, taken along a B-B' line of FIG. 1, in a step subsequent to the step of FIGS. 9A and 9B, involved in the method for forming the semiconductor device.
Figure 10B:
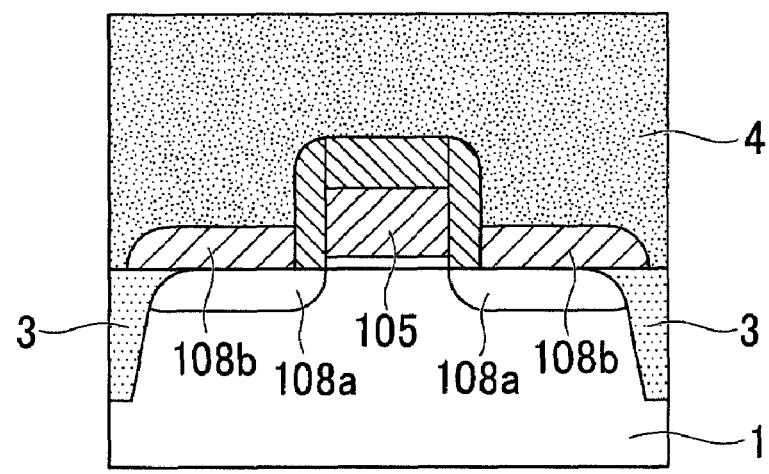
FIG. 10B is a fragmentary cross sectional elevation view illustrating the semiconductor device, taken along a D-D' line of FIG. 4, in the same step of FIG. 10A.

FIG. 10A is a fragmentary cross sectional elevation view illustrating the semiconductor device, taken along a B-B' line of FIG. 1, in a step subsequent to the step of FIGS. 9A and 9B, involved in the method for forming the semiconductor device. FIG. 10B is a fragmentary cross sectional elevation view illustrating the semiconductor device, taken along a D-D' line of FIG. 4, in the same step of FIG. 10A.

Figure 11A:
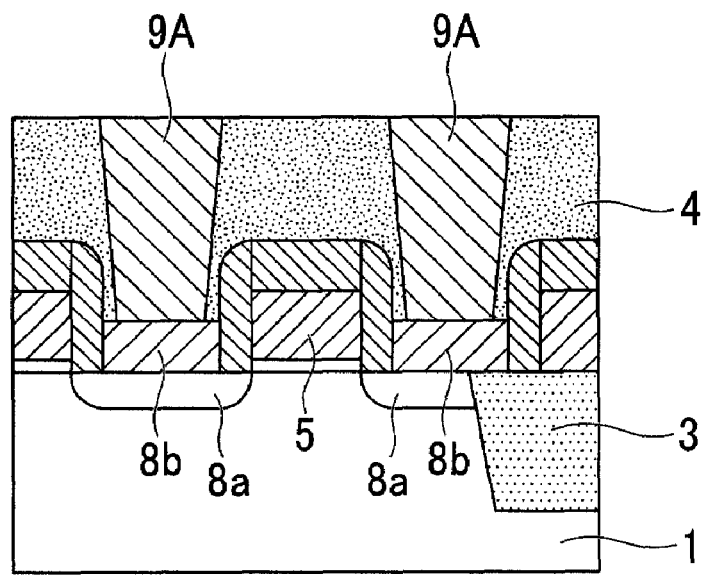
FIG. 11A is a fragmentary cross sectional elevation view illustrating the semiconductor device, taken along a B-B' line of FIG. 1, in a step subsequent to the step of FIGS. 10A and 10B, involved in the method for forming the semiconductor device.
Figure 11B:
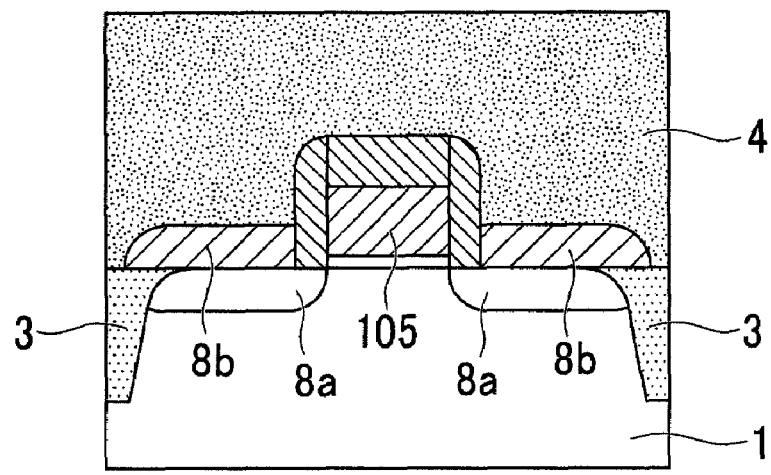
FIG. 11B is a fragmentary cross sectional elevation view illustrating the semiconductor device, taken along a D-D' line of FIG. 4, in the same step of FIG. 11A.

FIG. 11A is a fragmentary cross sectional elevation view illustrating the semiconductor device, taken along a B-B' line of FIG. 1, in a step subsequent to the step of FIGS. 10A and 10B, involved in the method for forming the semiconductor device. FIG. 11B is a fragmentary cross sectional elevation view illustrating the semiconductor device, taken along a D-D' line of FIG. 4, in the same step of FIG. 11A.

Figure 12A:
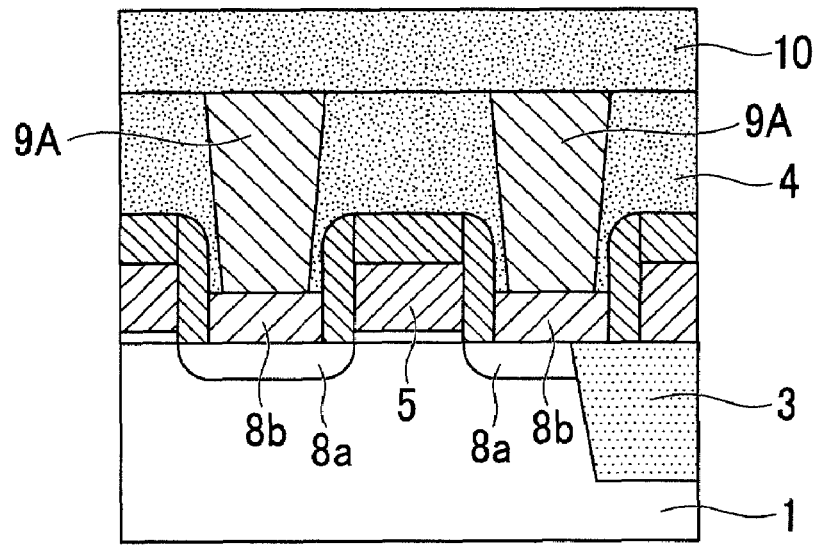
FIG. 12A is a fragmentary cross sectional elevation view illustrating the semiconductor device, taken along a B-B' line of FIG. 1, in a step subsequent to the step of FIGS. 11A and 11B, involved in the method for forming the semiconductor device.
Figure 12B:
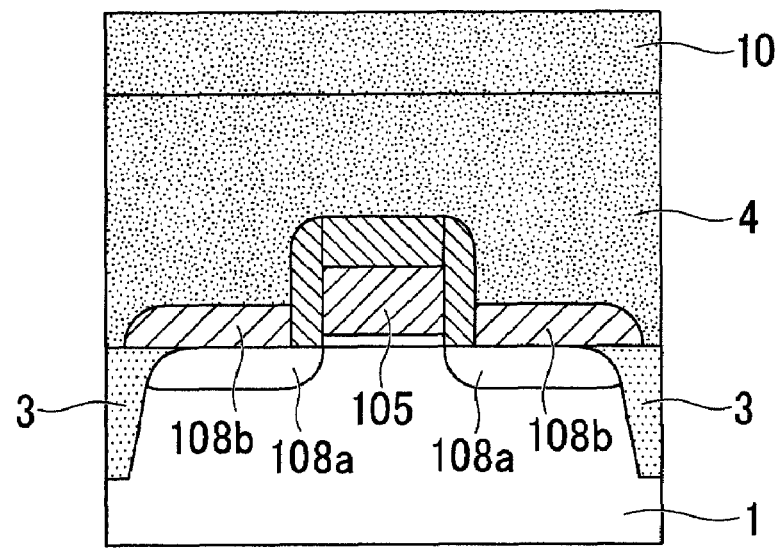
FIG. 12B is a fragmentary cross sectional elevation view illustrating the semiconductor device, taken along a D-D' line of FIG. 4, in the same step of FIG. 12A.

FIG. 12A is a fragmentary cross sectional elevation view illustrating the semiconductor device, taken along a B-B' line of FIG. 1, in a step subsequent to the step of FIGS. 11A and 11B, involved in the method for forming the semiconductor device. FIG. 12B is a fragmentary cross sectional elevation view illustrating the semiconductor device, taken along a D-D' line of FIG. 4, in the same step of FIG. 12A.

Figure 13A:
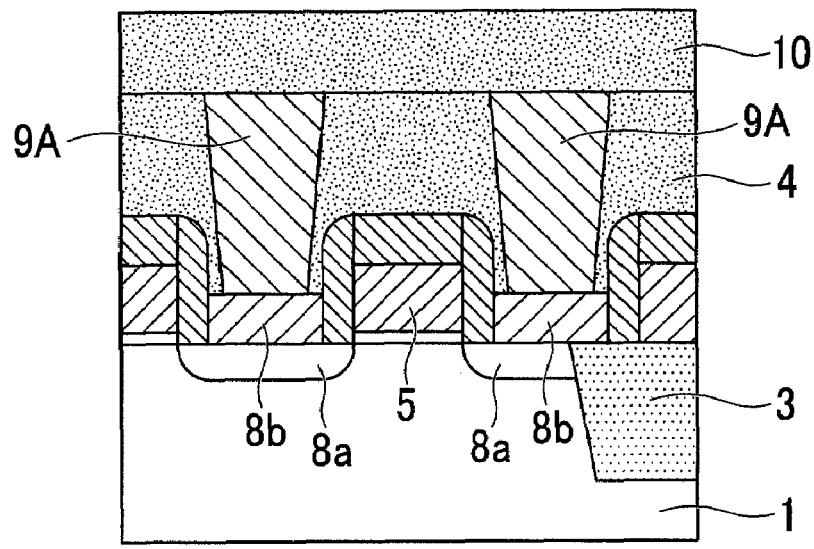
FIG. 13A is a fragmentary cross sectional elevation view illustrating the semiconductor device, taken along a B-B' line of FIG. 1, in a step subsequent to the step of FIGS. 12A and 12B, involved in the method for forming the semiconductor device.
Figure 13B:
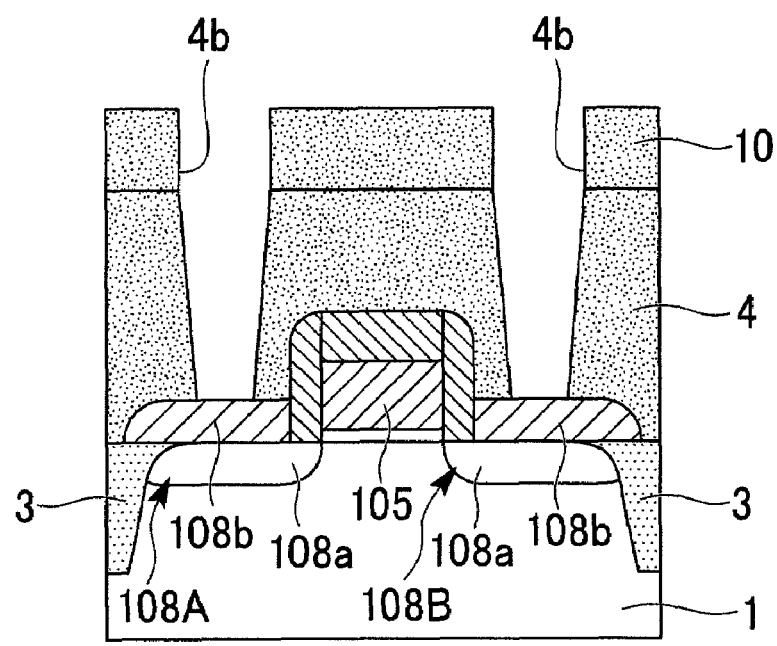
FIG. 13B is a fragmentary cross sectional elevation view illustrating the semiconductor device, taken along a D-D' line of FIG. 4, in the same step of FIG. 13A.

FIG. 13A is a fragmentary cross sectional elevation view illustrating the semiconductor device, taken along a B-B' line of FIG. 1, in a step subsequent to the step of FIGS. 12A and 12B, involved in the method for forming the semiconductor device. FIG. 13B is a fragmentary cross sectional elevation view illustrating the semiconductor device, taken along a D-D' line of FIG. 4, in the same step of FIG. 13A.

Figure 14A:
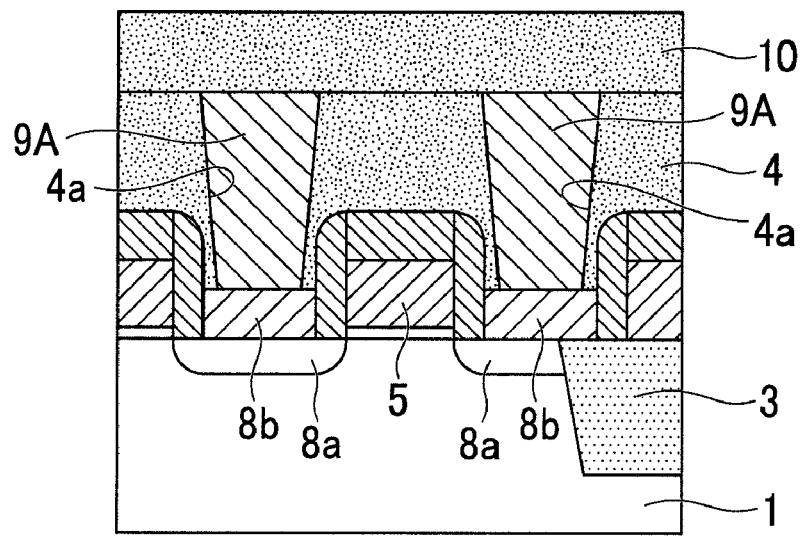
FIG. 14A is a fragmentary cross sectional elevation view illustrating the semiconductor device, taken along a B-B' line of FIG. 1, in a step subsequent to the step of FIGS. 13A and 13B, involved in the method for forming the semiconductor device.
Figure 14B:
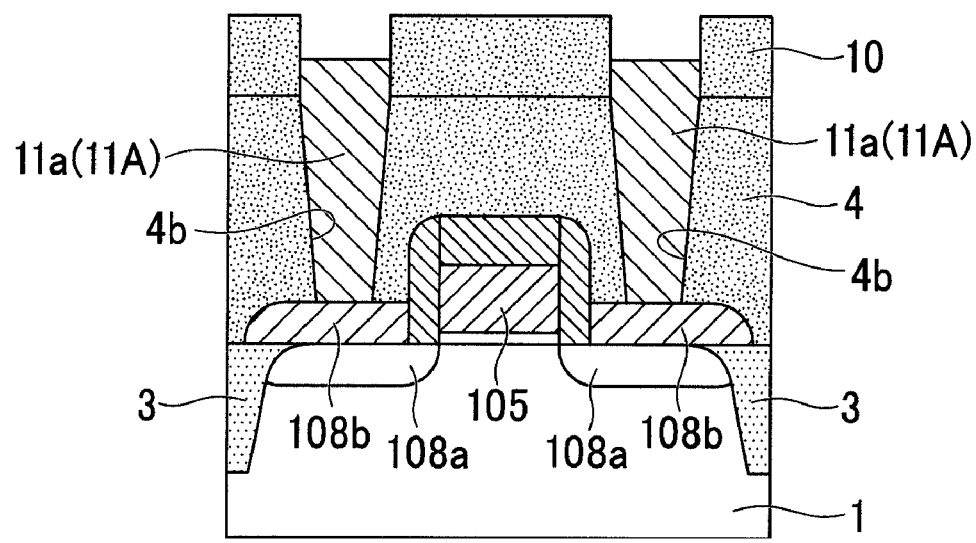
FIG. 14B is a fragmentary cross sectional elevation view illustrating the semiconductor device, taken along a D-D' line of FIG. 4, in the same step of FIG. 14A.

FIG. 14A is a fragmentary cross sectional elevation view illustrating the semiconductor device, taken along a B-B' line of FIG. 1, in a step subsequent to the step of FIGS. 13A and 13B, involved in the method for forming the semiconductor device. FIG. 14B is a fragmentary cross sectional elevation view illustrating the semiconductor device, taken along a D-D' line of FIG. 4, in the same step of FIG. 14A.

Figure 15A:
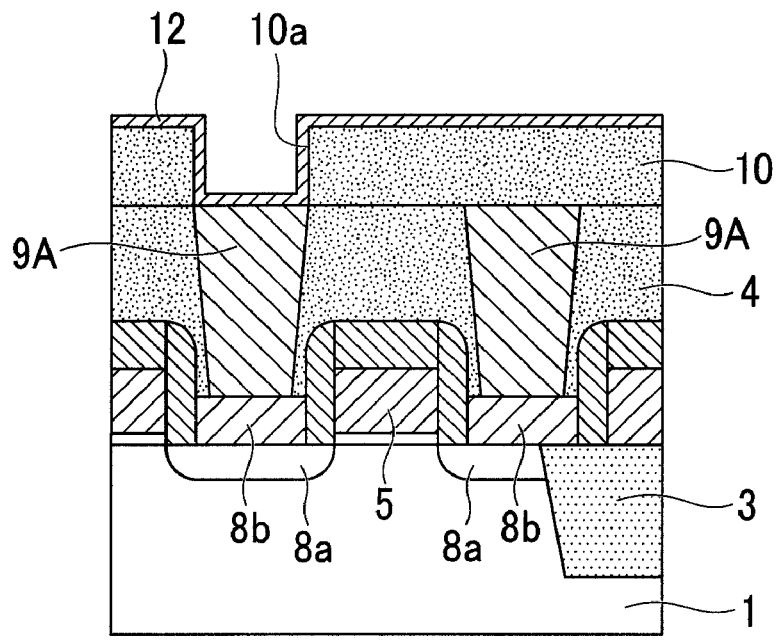
FIG. 15A is a fragmentary cross sectional elevation view illustrating the semiconductor device, taken along a B-B' line of FIG. 1, in a step subsequent to the step of FIGS. 14A and 14B, involved in the method for forming the semiconductor device.
Figure 15B:
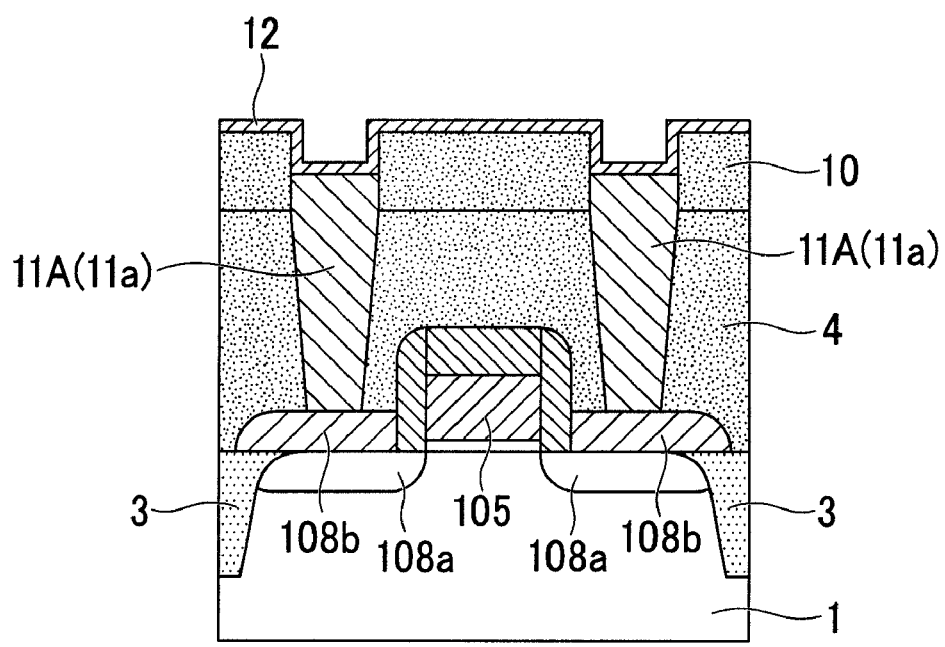
FIG. 15B is a fragmentary cross sectional elevation view illustrating the semiconductor device, taken along a D-D' line of FIG. 4, in the same step of FIG. 15A.

FIG. 15A is a fragmentary cross sectional elevation view illustrating the semiconductor device, taken along a B-B' line of FIG. 1, in a step subsequent to the step of FIGS. 14A and 14B, involved in the method for forming the semiconductor device. FIG. 15B is a fragmentary cross sectional elevation view illustrating the semiconductor device, taken along a D-D' line of FIG. 4, in the same step of FIG. 15A.

Figure 16A:
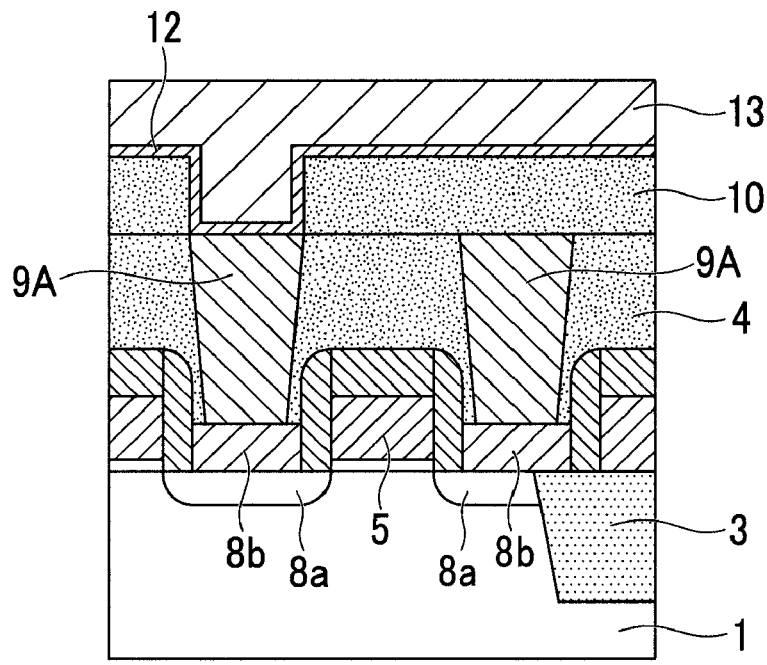
FIG. 16A is a fragmentary cross sectional elevation view illustrating the semiconductor device, taken along a B-B' line of FIG. 1, in a step subsequent to the step of FIGS. 15A and 15B, involved in the method for forming the semiconductor device.
Figure 16B:
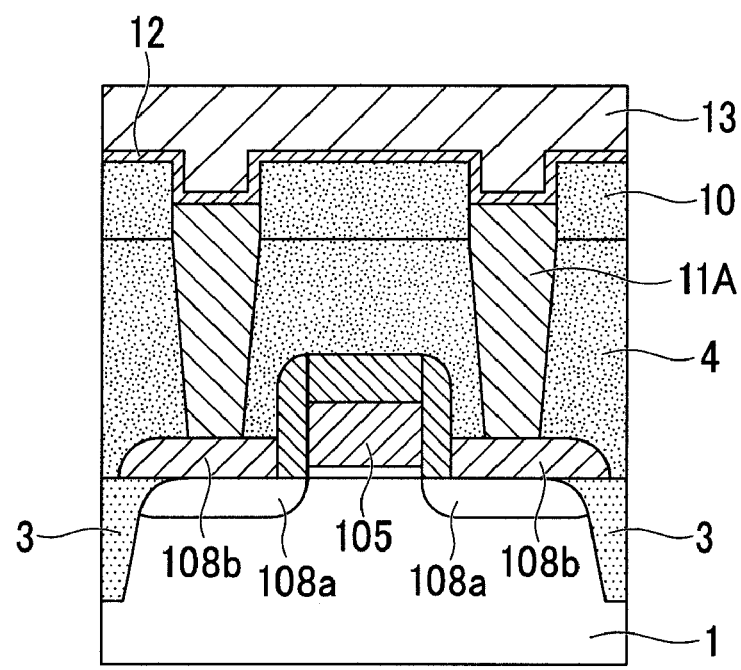
FIG. 16B is a fragmentary cross sectional elevation view illustrating the semiconductor device, taken along a D-D' line of FIG. 4, in the same step of FIG. 16A.

FIG. 16A is a fragmentary cross sectional elevation view illustrating the semiconductor device, taken along a B-B' line of FIG. 1, in a step subsequent to the step of FIGS. 15A and 15B, involved in the method for forming the semiconductor device. FIG. 16B is a fragmentary cross sectional elevation view illustrating the semiconductor device, taken along a D-D' line of FIG. 4, in the same step of FIG. 16A.

Figure 17A:
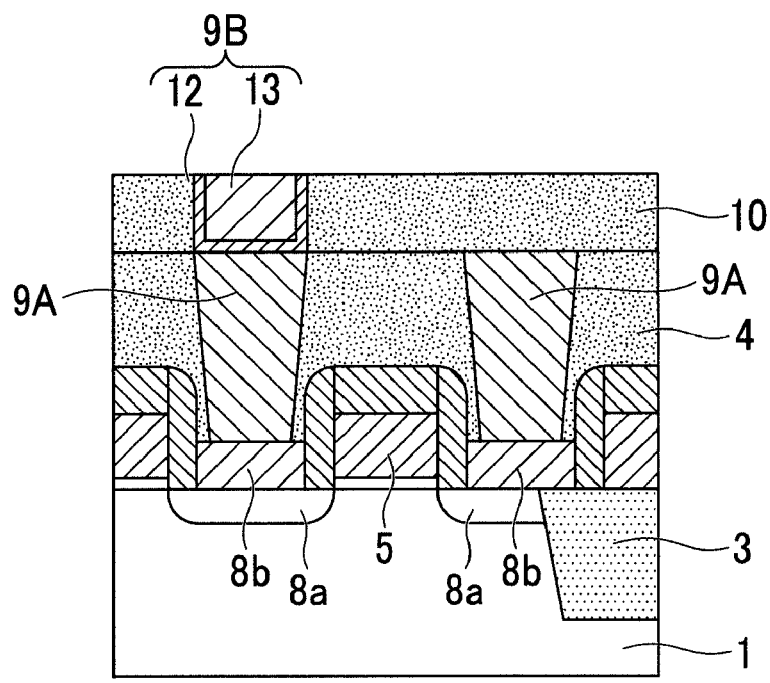
FIG. 17A is a fragmentary cross sectional elevation view illustrating the semiconductor device, taken along a B-B' line of FIG. 1, in a step subsequent to the step of FIGS. 16A and 16B, involved in the method for forming the semiconductor device.
Figure 17B:
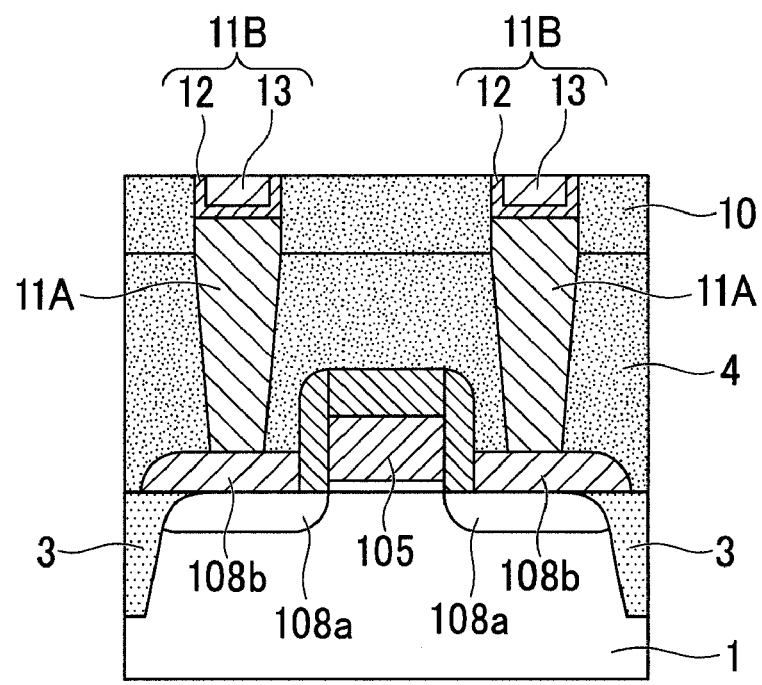
FIG. 17B is a fragmentary cross sectional elevation view illustrating the semiconductor device, taken along a D-D' line of FIG. 4, in the same step of FIG. 17A.

FIG. 17A is a fragmentary cross sectional elevation view illustrating the semiconductor device, taken along a B-B' line of FIG. 1, in a step subsequent to the step of FIGS. 16A and 16B, involved in the method for forming the semiconductor device. FIG. 17B is a fragmentary cross sectional elevation view illustrating the semiconductor device, taken along a D-D' line of FIG. 4, in the same step of FIG. 17A.

As shown in FIGS. 7A and 7B, a p-type single crystal silicon substrate 1 having a main face is prepared. A silicon oxide isolation film 3 is selectively formed in a passive region of the substrate 1 by a shallow trench isolation method. The isolation film 3 defines a two-dimensional array of active regions K. Each of the active regions K is separated by the isolation film 3 from other active regions K.

A thermal oxidation process is carried out to oxidize the surface of the semiconductor substrate 1, thereby forming gate insulating films 5a and 105a. The gate insulating films 5a and 105a have a thickness of 4 nanometers.

A chemical vapor deposition process is carried out using source gases of monosilane ($SiH_4$) and phosphine ($PH_3$), thereby forming a polycrystalline silicon film over the gate insulating films 5a and 105a. The polycrystalline silicon film contains a p-type impurity. The polycrystalline silicon films have a thickness of 70 nanometers. A sputtering process is carried out to form a refractory metal film over the polycrystalline silicon film, thereby forming a stack of the polycrystalline silicon film and the refractory metal film. The refractory metal film has a thickness of 50 nanometers. The refractory metal film may be made of any refractory metal such as tungsten, tungsten nitride, or tungsten silicide. In a later step, the stack of the polycrystalline silicon film and the refractory metal film will be patterned to form gate electrodes 5 and 105.

A plasma enhanced chemical vapor deposition process is carried out using source gases of monosilane ($SiH_4$) and ammonium ($NH_3$), thereby forming a silicon nitride film over the stack of the polycrystalline silicon film and the refractory metal film. The silicon nitride film has a thickness of 70 nanometers. A resist is applied on the silicon nitride film. A lithography process is carried out to form a resist pattern over the silicon nitride film that is disposed over the stack of the polycrystalline silicon film and the refractory metal film. The resist pattern provides a pattern for forming gate electrodes 5 and 105 in the later step.

An anisotropic etching process is carried out using the resist pattern as a mask so as to selectively etch the silicon nitride film, thereby patterning silicon nitride films 5c and 105c. The used resist pattern is then removed. A further anisotropic etching process is carried out using the patterned silicon nitride films 5c and 105c as a mask so as to selectively etch the stack of the polycrystalline silicon film and the refractory metal film, thereby forming gate electrodes 5 and 105.

A chemical vapor deposition process is carried out to entirely form a silicon nitride film having a thickness of 40 nanometers. An etch back process is then carried out to etch back the silicon nitride film, thereby forming silicon nitride side walls 5b and 105b on the side walls of the gate electrodes 5 and 105.

An ion-implantation process is carried out using the gate electrodes 5 and 105 and the side walls 5b and 105b as masks so as to selectively introduce an n-type impurity into the substrate 1. The ion-implantation process is carried out at an implantation energy in the range of 15 keV to 30 keV and at a dose in the range of $5E12$ cm$^{-2}$ to $1E13$ cm$^{-2}$. The n-type impurity may be, but is not limited to, As. An annealing process is then carried out in a nitrogen atmosphere at a temperature in the range of 900° C. to 1000° C. for 1 minute, thereby forming impurity diffusion layers 8a and 108a in the semiconductor substrate 1.

In a modified case, the ion-implantation process for forming the impurity diffusion layers 8a and 108a may be carried out under the same conditions before the side walls 5b and 105b are formed.

In other modified case, the impurity diffusion layers 8a and 108a may be formed, without using any ion-implantation process, by a thermal diffusion from impurity containing epitaxial layers after the impurity containing epitaxial layers have been formed over the impurity diffusion layers 8a and 108a.

A wet etching process is carried out to remove damages on the silicon surfaces of the impurity diffusion layers 8a and 108a as well as remove a thin silicon oxide film that has been unintentionally formed on the silicon surfaces. The wet etching process may be carried out using a diluted hydrofluoric acid solution as an etchant. The wet etching process may be continued for 60 seconds.

As shown in FIGS. 8A and 8B, a selective epitaxial growth process is carried out using the silicon nitride films 5c and 105c and the side walls 5b and 105b as selective masks, thereby forming first epitaxial layers 8b and 108b over the impurity diffusion layers 8a and 108a. Typical examples of the selective epitaxial growth method may be, but is not limited to, a selective chemical vapor deposition that is carried out using hydrogen chloride (HCl) and dichlorosilane (SiH$_2$Cl$_2$) in a hydrogen atmosphere (H) at a temperature of 800° C. The first epitaxial layers 8b and 108b may, for example, have a thickness of about 30 nanometers.

An ion-implantation process is carried out using the gate electrodes 5 and 105 and the side walls 5b and 105b as masks so as to selectively introduce an n-type impurity into the first epitaxial layers 8b and 108b. The ion-implantation process is carried out at an implantation energy of 30 keV and at a dose of $3E13$ cm$^{-2}$. The n-type impurity may be, but is not limited to, As. As a result, source regions 8A and 108A and drain regions 8B and 108B are formed. The source region 8A includes a stack of the impurity diffusion layer 8a and the first epitaxial layer 8b. The source region 108A includes a stack of the impurity diffusion layer 108a and the first epitaxial layer 108b. The source region 8B includes another stack of the impurity diffusion layer 8a and the first epitaxial layer 8b. The source region 108B includes another stack of the impurity diffusion layer 108a and the first epitaxial layer 108b.

As shown in FIGS. 9A and 9B, a first inter-layer insulator 4 is formed which covers the first epitaxial layers 8b and 108b, the silicon nitride films 5c and 105c and the side walls 5b and 105b. The first inter-layer insulator 4 may be formed by a law pressure chemical vapor deposition process. The first inter-layer insulator 4 may be made of silicon oxide. In some cases, the first inter-layer insulator 4 may have a thickness of about 600 nanometers. The first inter-layer insulator 4 has a non-flat top surface due to the presence of the gate electrodes 5 and 105. In order to planarize the surface of the first inter-layer insulator 4, a chemical mechanical polishing process is carried out to polish the surface of the first inter-layer insulator 4 so that the thickness of the first inter-layer insulator 4 is reduced to about 200 nanometers.

As shown in FIGS. 10A and 10B, contact holes 4a are formed in the first inter-layer insulator 4 by a lithography and a dry etching process, so that the contact holes 4 reach the surfaces of the first epitaxial layers 8b of the source and drain regions 8A and 8B. In a modified case, the contact holes 4a may be formed by using the known self aligned contact method.

As shown in FIGS. 11A and 11B, contact plugs 9A are formed in the contact holes 4a. The contact plugs 9A contact with the first epitaxial layers 8b and 108b. For forming the contact plugs 9A, a phosphorous-doped silicon layer is entirely formed, which fills up the contact holes 4a and extends over the first inter-layer insulator 4. A chemical mechanical polishing process is then carried out to polish the phosphorous-doped silicon layer so as to remove the phosphorous-doped silicon layer over the first inter-layer insulator 4, while leaving the phosphorous-doped silicon layer within the contact holes 4a, thereby forming the contact plugs 9A in the contact holes 4a.

In some cases, the phosphorous-doped silicon layer may have a multi-layered structure that includes first to third layers. The first to third layers are sequentially formed in this order. The first layer may be a silicon layer that has a thickness of 20 nanometers and a phosphorous concentration of $1E20$ cm$^{-3}$. The second layer may be a silicon layer that has a thickness of 120 nanometers and a phosphorous concentration of $4E20$ cm$^{-3}$. The third layer may be a silicon layer that has a thickness of 230 nanometers and a phosphorous concentration of $1E20$ cm$^{-3}$. The phosphorous-doped silicon layer may also be modified as long as the phosphorous-doped silicon layer fills up the contact holes 4a. The number of the layers of the phosphorous-doped silicon layer may be modified. Each thickness of the layers of the phosphorous-doped silicon layer may also be modified. The thickness of the phosphorous-doped silicon layer may also be modified. The phosphorous concentration of each layer may also be modified.

As shown in FIGS. 12A and 12B, a second inter-layer insulator 10 is formed over the first inter-layer insulator 4 and the contact plugs 9A. The second inter-layer insulator 10 may be formed by a low pressure chemical vapor deposition method. The second inter-layer insulator 10 may be made of silicon oxide. The second inter-layer insulator 10 may have a thickness of 200 nanometers.

As shown in FIGS. 13A and 13B, contact holes 4b are formed which penetrate the first and second inter-layer insulators 4 and 10, so that the contact holes 4b reach the first epitaxial layers 108b. The contact holes 4 and 10 may be formed by a lithography process and a dry etching process.

As shown in FIGS. 14A and 14B, contact plugs 11A are formed in the contact holes 4b. The contact plugs 11A fill up the contact holes 4b, except for shallower or upper portions of the contact holes 4b. The contact plugs 11A may have the top level that is lower than the top level of the second interlayer insulator and higher than the top level of the first inter-layer insulator 4.

The contact plugs 11A may be realized by second epitaxial layers. In this case, for forming the contact plugs 11A, a selective epitaxial growth process is carried out using the first and second inter-layer insulators 4 and 10 as selective masks, thereby forming second epitaxial layers 11a in the contact holes 4b and over the surfaces of the first epitaxial layers 108b. Typical examples of the selective epitaxial growth method may be, but is not limited to, a selective chemical vapor deposition that is carried out using hydrogen chloride (HCl) and dichlorosilane ($SiH_2Cl_2$) in a hydrogen atmosphere (H) at a temperature of 800° C. The second epitaxial layers 11a may, for example, have a thickness of about 150 nanometers. Typically, the second epitaxial layer 11A may have a thickness of about 150 nanometers. The thickness is equal to a distance between the bottom and the top of the contact plug 11A. In other words, the thickness is defined from the surface of the first epitaxial layers 108b.

As shown in FIGS. 15A and 15B, contact holes 10a are formed in the second inter-layer insulator 10, so that the contact holes 10a reach the contact plugs 9A. The top surfaces of the contact plugs 9A are shown through the contact holes 10a.

An ion-implantation process is carried out using the first and second inter-layer insulators 4 and 10 as masks so as to introduce an n-type impurity into the contact plugs 9A and the second epitaxial layers 11a, thereby reducing the resistances of the contact plugs 9A and the second epitaxial layers 11a. The ion-implantation process may be carried out at an implantation energy of 25 keV and at a dose of 2.5E15 $cm^{-2}$. A typical example of the n-type impurity may be, but is not limited to, As. The second epitaxial layers 11a are doped with the n-type impurity, thereby forming the contact plugs 11A in the contact holes 4b. The contact plugs 11A contact with the diffusion layers 108b.

A chemical vapor deposition process is carried out to form a titanium/titanium nitride film 12 over the second inter-layer insulator 10 as well as on the side walls of the contact holes 10a and the top surface of the contact plug 9A, and on the side walls of the shallower portions of the contact holes 4b and the top surface of the contact plugs 11A. Namely, the titanium/titanium nitride film 12 covers the contact plugs 9A and 11A. The titanium/titanium nitride film 12 is a stack of a titanium layer and a titanium nitride layer that is formed on the titanium layer. The titanium layer contacts with the top of the contact plugs 9A and 11A. Titanium in the titanium layer reacts with silicon in the contact plugs 9A and 11A, thereby forming titanium silicide when the titanium layer is formed.

As shown in FIGS. 16A and 16B, a sputtering process is carried out to form a metal film 13 on the titanium/titanium nitride film 12. The metal film 13 covers at least the titanium/titanium nitride film 12. The metal film 13 may, for example, be made of tungsten. The metal film 13 over the second inter-layer insulator 10 may have a thickness of 200 nanometers.

As shown in FIGS. 17A and 17B, a chemical mechanical polishing process is carried out to polish the metal film 13 and the titanium/titanium nitride film 12 so as to remove the metal film 13 and the titanium/titanium nitride film 12 over the second inter-layer insulator 10, while leaving the metal film 13 and the titanium/titanium nitride film 12 within the contact holes of the second inter-layer insulator 10, thereby forming a first bit-line contact plug 9B over the contact plug 9B, and also forming pad metal layers 11B over the contact plugs 11A.

With reference back to FIG. 3, a third inter-layer insulator 20 is formed over the second inter-layer insulator 10 and the first bit-line contact plug 9B as well as over the pad metal layers 11B. A contact hole is formed in the third inter-layer insulator 20. The contact hole communicates with the first bit-line contact plug 9B. A second bit-line contact plug 23 is formed in the contact hole. The second bit-line contact plug 23 contacts with the first bit-line contact plug 9B. The second bit-line contact plug 23 is electrically connected through the first bit-line contact plug 9B and the contact plug 9A to the source region 8A.

A bit-line 106 and interconnection layers are concurrently formed over the third inter-layer insulator 20. The bit-line 106 contacts with the second bit-line contact plug 23. The interconnection layers contact with the pad metal layers 11B. The bit-line 106 is electrically connected through the second bit-line contact plug 23, the first bit-line contact plug 9B and the contact plug 9A to the source region 8A. The bit-line 106 may be formed of a stack of a tungsten nitride film and a tungsten film. The interconnection layers are electrically connected through the pad metal layers 11B and the contact plugs 11A to the source and drain regions 108A and 108B.

A fourth inter-layer insulator 21 is formed over the third inter-layer insulator 20, the bit-line 106 and the interconnection layers. A capacitor contact holes is formed which penetrates the second, third and fourth inter-layer insulators 10, 20 and 21 so that the contact hole communicates with the contact plug 9A that is connected to the drain region 8B. A capacitor contact plug 25 is formed in the capacitor contact hole. The capacitor contact plug 25 contacts with the contact plug 9A that is connected to the drain region 8B. The capacitor contact plug 25 is connected through the contact plug 9A to the drain region 8B.

A fifth inter-layer insulator 22 is formed over the fourth inter-layer insulator 21 and the capacitor contact plug 25. A capacitor hole is formed in the fifth inter-layer insulator 22. The capacitor hole reaches the capacitor contact plug 25. A capacitor 24 is formed in the capacitor hole. The capacitor 24 contacts with the capacitor contact plug 25. The capacitor 24 has a bottom electrode film which contacts with the capacitor contact plug 25 and the bottom and side wall of the capacitor hole. The capacitor 24 also has a capacitive insulating film that is formed on the bottom electrode. The capacitor 24 also has an opposite electrode film that is formed on the capacitive insulating film and on the fifth inter-layer insulator 22. As a result, the semiconductor device shown in FIGS. 1 through 6 is completed.

As described above, the semiconductor device includes the memory cell area and the peripheral circuit area. The memory cell area includes the MOS transistor Tr1. The peripheral circuit area includes the MOS transistor Tr2. In the peripheral circuit area, the contact plug 11A is realized by using the second epitaxial layer 11a that is impurity-diffused. The impurity diffusion reduces electric resistance of the contact plug 11A. Reduction in the electric resistance of the contact plug 11A reduces contact resistance between the contact plug 11A and the pad metal layer 11B. Reductions of the electric resistance of the contact plug 11A and the contact resistance can present any substantive reduction of ON-current of the MOS transistor Tr2.

In the memory cell area, the contact plug 9A is diffused with the n-type impurity which has been introduced through the ion-implantation. The impurity diffusion reduces electric resistance of the contact plug 9A. Reduction in the electric resistance of the contact plug 9A reduces contact resistance between the contact plug 9A and the bit-line contact plug 11B. Reductions of the electric resistance of the contact plug 9A and the contact resistance can present any substantive reduction of ON-current of the MOS transistor Tr1.

For the MOS transistor Tr1 in the memory cell area, each of the source region 8A and the drain region 8B includes the impurity diffusion layer 8a and the first epitaxial layer 8b. The impurity diffusion layer 8a is formed in the semiconductor substrate 1. The first epitaxial layer 8b is formed over the impurity diffusion layer 8a. This structure allows the channel length to be so long as to suppress the short channel effects of the MOS transistor Tr1 when the semiconductor device is shrunken.

For the MOS transistor Tr2 in the peripheral circuit area, each of the source region 108A and the drain region 108B includes the impurity diffusion layer 108a and the first epitaxial layer 108b. The impurity diffusion layer 108a is formed in the semiconductor substrate 1. The first epitaxial layer 108b is formed over the impurity diffusion layer 108a. This structure allows the channel length to be so long as to suppress the short channel effects of the MOS transistor Tr2 when the semiconductor device is shrunken.

The semiconductor device can be fabricated as described above. For the MOS transistor Tr2 in the peripheral circuit area, the first epitaxial layers 108b are formed over the impurity diffusion layers 108a. No ion-implantation to introduce an impurity into the first epitaxial layers 108b is carried out. The second epitaxial layers 11a are formed over the first epitaxial layers 108b free of any impurity as introduced. An ion-implantation is carried out to introduce an impurity into the second epitaxial layers 11a as the contact plugs 11A but not into the first epitaxial layers 108b. The impurity being once introduced at a high concentration into the second epitaxial layers 11a is then diffused from the second epitaxial layers 11a into the first epitaxial layers 108b. It is not possible that in the ion-implantation the impurity can pass through the first epitaxial layers 108b and be implanted into the impurity diffusion layers 108a. This allows suppress the short channel effects of the MOS transistor Tr2.

For the MOS transistor Tr1 in the memory cell area, the first epitaxial layers 8b are formed over the impurity diffusion layers 8a. No ion-implantation to introduce an impurity into the first epitaxial layers 8b is carried out. The contact plugs 9A of impurity-doped silicon are formed over the first epitaxial layers 8b. A further impurity diffusion is carried out to diffuse impurity into the contact plugs 9A, thereby further reducing the resistivity of the conduct plugs 9A. After the contact plugs 9A have been formed, an impurity is then diffused into the conduct plugs 9A. It is not possible that the impurity can pass through the first epitaxial layers 8b and be implanted into the impurity diffusion layers 8a. This allows suppress the short channel effects of the MOS transistor Tr1.

In the MOS transistor Tr1 in the memory cell area, the first epitaxial layers 8b are formed over the impurity diffusion layers 8a in the substrate 1. The first epitaxial layers 8b are positioned above the substrate 1. In other words, each of the source and drain regions 8A and 8B has an upper region which is positioned above the substrate 1. This allows suppress the short channel effects of the MOS transistor Tr1.

In the MOS transistor Tr2 in the memory cell area, the first epitaxial layers 108b are formed over the impurity diffusion layers 108a in the substrate 1. The first epitaxial layers 108b are positioned above the substrate 1. In other words, each of the source and drain regions 108A and 108B has an upper region which is positioned above the substrate 1. This allows suppress the short channel effects of the MOS transistor Tr2.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a MOS transistor in an active region surrounded by an isolation film, the method comprising:
    forming a gate insulating film on a first part of the active region;
    forming a gate electrode on the gate insulating film;
    forming diffusion layers in second parts of the active region, the second parts being different from the first part;
    forming first silicon layers on the diffusion layers by selective epitaxial method to form source and drain regions which comprise stacks of the first silicon layers and the diffusion layers;
    forming an inter-layer insulator which covers the gate electrode and the source and drain regions;
    forming contact holes in the inter-layer insulator, the contact holes reaching the source and drain regions;
    forming second silicon layers in the contact holes, the second silicon layers contacting with the source and drain regions; wherein a second impurity is introduced into the second silicon layers, and the second impurity is diffused to the first silicon layer.

2. The method according to claim 1, wherein a first impurity is introduced into the first silicon layers before forming an inter-layer insulator which covers the gate electrode and the source and drain regions.

3. The method according to claim 1, wherein the second silicon layer is formed by selective epitaxial method.

4. The method according to claim 3, wherein the impurity is introduced by ion implantation from a top surface of the second silicon layer.

5. The method according to claim 1, wherein the second silicon layer is formed by depositing a phosphorous-doped silicon layer and removing a part of the phosphorous-doped silicon layer to form a contact plug.

6. The method according to claim 1, wherein the level of a top surface of the second silicon layers is lower than the level of a top surface of the inter-layer insulator.

7. The method according to claim 6, further comprising:
    forming a metal layer on the second silicon layers and the inter-layer insulator; and
    removing a part of the metal layer by chemical mechanical polishing method, while having the metal layer remain in the contact holes.

* * * * *